(12) United States Patent
Huber

(10) Patent No.: US 11,183,980 B1
(45) Date of Patent: Nov. 23, 2021

(54) POWER AMPLIFIER HAVING A SPREAD OF GRADED OUTPUTS

(71) Applicant: Micron Technology, Inc., Boise, ID (US)

(72) Inventor: Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/925,590

(22) Filed: Jul. 10, 2020

(51) Int. Cl.
| | |
|---|---|
| *H03F 3/45* | (2006.01) |
| *H03K 3/037* | (2006.01) |
| *G11C 11/4096* | (2006.01) |
| *G11C 11/4091* | (2006.01) |
| *G11C 11/4076* | (2006.01) |

(52) U.S. Cl.
CPC ...... *H03F 3/45179* (2013.01); *G11C 11/4076* (2013.01); *G11C 11/4091* (2013.01); *G11C 11/4096* (2013.01); *H03K 3/037* (2013.01); *H03F 2203/45054* (2013.01)

(58) Field of Classification Search
CPC ....... H03F 3/45179; H03F 2203/45054; G11C 11/4096; G11C 11/4076; G11C 11/4091; H03K 3/037
USPC ........................................................ 365/149
See application file for complete search history.

(56) References Cited

U.S. PATENT DOCUMENTS

| | | | | |
|---|---|---|---|---|
| 8,736,473 | B2 * | 5/2014 | Dijkmans | H03M 3/434 341/143 |
| 2012/0056681 | A1 * | 3/2012 | Lee | H03F 1/0277 330/310 |
| 2013/0321080 | A1 * | 12/2013 | Jahanian | H03F 1/3211 330/253 |
| 2014/0340150 | A1 * | 11/2014 | Dempsey | H03F 1/223 330/260 |
| 2020/0333818 | A1 * | 10/2020 | Yun | G11C 5/147 |
| 2021/0099171 | A1 * | 4/2021 | Man | H03K 17/6871 |

FOREIGN PATENT DOCUMENTS

WO    WO-2013093159 A1 *    6/2013    ........... G01R 31/316

* cited by examiner

*Primary Examiner* — Fernando Hidalgo
(74) *Attorney, Agent, or Firm* — Fletcher Yoder, P.C.

(57) ABSTRACT

Techniques described herein are related to spread amplifier having a differential amplifier spread (DAS) configured to receive a pair of input signals and to provide a plurality of graded outputs each having different output levels. The spread amplifier further includes a final driver stage having a plurality of final drivers, wherein each of the final drivers is configured to receive a respective one of the plurality of graded outputs. The spread amplifier may be used for the regulation of various voltages such as VDQS and VARY.

29 Claims, 8 Drawing Sheets

US 11,183,980 B1

POWER AMPLIFIER HAVING A SPREAD OF GRADED OUTPUTS

BACKGROUND

The present disclosure relates generally to power amplifiers and, more particularly, to power amplifiers having a spread of graded outputs.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system includes processing circuitry, such as one or more processors or other suitable components, and memory devices, such as chips or integrated circuits. One or more memory devices may be implemented on a memory module as part of a memory array, such as a dynamic random-access memory (DRAM) device employed on a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for the operation. In addition, in some cases, data output from the operation may be stored in memory, for example, to enable subsequent retrieval.

These memory devices may include one or more power amplifiers to increase the magnitude of the power of various input signals utilized in the memory device. However, conventional power amplifiers may utilize excessive overhead power for a given power amplification. Other power amplifiers that digitize a single output have associated switching noise to approximate analog. Embodiments of the invention are directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION

Figure 1:
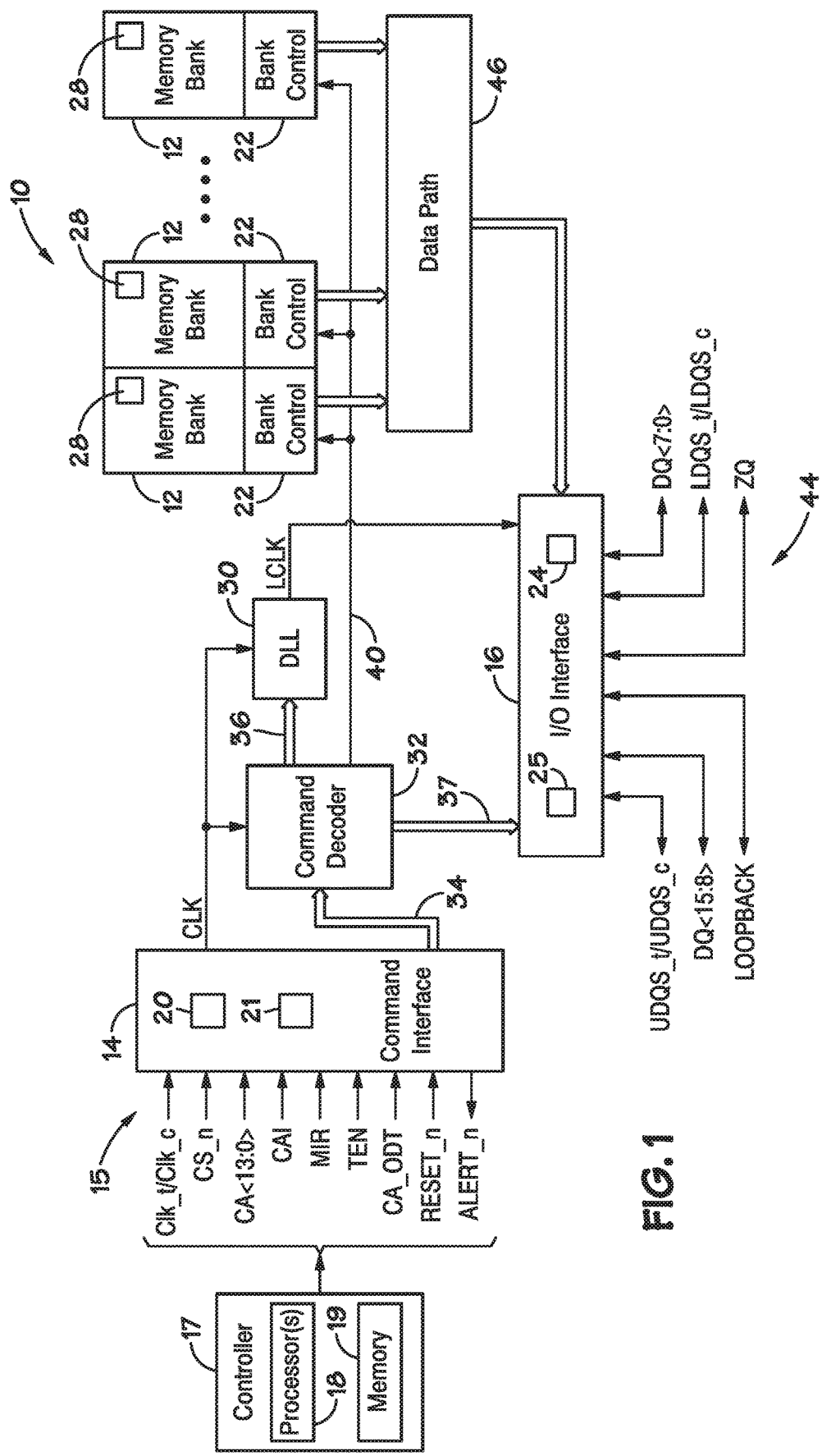
FIG. 1 is a block diagram of a memory device that may employ power amplifiers, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

During operation of semiconductor devices, such as memory devices, the timing of signals is often critical to proper functionality. For instance, memory devices generally operate under the control of one or more controllers or processors which send commands to access data stored in a particular address/location in the memory device. Internal clock distribution networks (or "timing trees") within the memory device are generally tasked with providing multiple internal clock signals to ensure proper timing for accessing the various memory locations. The multiple internal clock signals may be derived from a single input clock signal received at the memory device and distributed to the various internal components of the memory device. As processing and command signal frequencies continue to increase, data capture (e.g., for write operations) becomes increasingly more challenging. For instance, larger memory implementations may induce longer communication channels and correspondingly more avenues for noise introduction and reflections, increasing complexity of efficient data capture. As will be appreciated, reduction of input clock tree timing variation for data capture generally provides improved operation of the memory device.

For clock trees in particular, the step function load effect of the input clock tree being enabled or disabled for various clock signals may disadvantageously induce significant variations in the regulated supply voltage signal if there are weaknesses in either regulation response and/or effective local capacitance to support these step function changes. Preconditioning may be used to reduce voltage supply variation. However, regulation response, effective local capacitance, and preconditioning may each introduce various design challenges or drawbacks.

For instance, to improve regulation response, power amplifiers may be used, but typical power amplifiers often employ significant biasing increases, negatively impacting power usage. Alternatively, providing a large amount of effective local capacitance may be achieved by placing capacitance directly at the load areas. However, this can grow these high frequency areas, disadvantageously increasing power usage. Still another alternative to improve regulation response may be to make the capacitance appear local by connecting remote capacitance with wide metal bussing to the load point. However, this solution again grows these high frequency areas by reducing usable metal unless another level of metal is added which may increase processing costs. Finally, while preconditioning may reduce voltage supply variation, it can lead to higher power overhead cost.

Another prior known method for implementing a power amplifier includes digitizing before controlling the final output stage. However, digital switching of this final output stage is inherently noisy. Even with large amounts of smoothing capacitance, the result can be noisy and may not be suitable for sensitive circuits that require tight control.

Thus, in accordance with the present embodiments, a power amplifier includes multiple graded flip points. Further, the multiple graded flip points control separate final drivers s to approximate analog response. As will be described, because there is a digital portion of the path to the final drivers, the path can be gated to allow a step function response to enablement and disablement of the clock tree (or other circuitry that may be coupled to (e.g., regulated or controlled by) the power amplifier described herein).

As will be described further below, in its simplest form as a regulator, a standard power amplifier includes only one output to drive the gate of one final driver (e.g., a final drive transistor) directly. In accordance with the disclosed embodiments, "grading" includes combining different differential pair controlled mirror leg strengths to obtain different output levels in response to the inputs of the differential pair at the frontend of the power amplifier. This grading provides a spread of outputs, and thus the improved power amplifier described herein may be referred to as a "spread amplifier," or "SpreadAmp". These outputs may be digitized and buffered by a gate chain where other gating inputs can be applied, as well. The final outputs are provided to multiple final drive transistors of the SpreadAmp (e.g., one drive transistor for each graded output of flip point). Advantageously, the spread of digitized outputs allows approximation of analog signals while benefiting from the high gain fan-out and transmission of digital signals.

Thus, the present embodiments include a power amplifier that provides a spread of graded outputs (i.e., a SpreadAmp). These graded outputs of the SpreadAmp are digitized where they benefit from digital fanout, wherein each output is provided to a corresponding final driver. In addition, logic gating methods may be employed before enabling final drivers, to provide additional benefits described in detail below. With the digital portion providing high gain fan-out and transmission, more final drive capability for a given power amplifier bias overhead current or conversely stated, less bias current for similar drive when compared to prior, fully analog power amplifiers may be achieved. Comparative power regulation implementations have shown greater than 7× reduction in overhead current for large loads. Various examples of implementations using the disclosed SpreadAmp in a memory device are discussed below.

As described, logic gating in the final driver path of the SpreadAmp provides additional benefits of the disclosed designs, such as near instant-on final drive, reconfiguration of final drive transistors used, and/or combination with memory elements for increasing effective final driver resolution and control without increasing the number graded outputs. As further discussed, when the disclosed SpreadAmp is in a class B style full push-pull configuration, it performs similar in voltage control as a class AB style standard power amplifier, without the associated class AB crossover currents. When using multiple traditional class AB power amplifiers to support a distributed network, the inherent level control offsets due to transistor micro-variation induce fight currents between the amplifiers unless deadband is added to prevent this. Advantageously, the disclosed SpreadAmp allows for a master-slave technique, eliminating fight currents when multiple SpreadAmp's are on the same output node in a full push-pull configuration.

Thus, the disclosed SpreadAmp and implementations thereof provide a spread of graded outputs that are later digitized thereby approximating analog control more closely than the prior techniques. This approach may be implemented using less overhead current and area compared to a prior analog approach. Because a digital signal is provided to the final drivers, it can be gated to allow step function response to enablement and disablement of the clock tree (or other circuitry that may be regulated by the disclosed SpreadAmp), thereby reducing supply voltage signal variations, such that the clock tree delay is consistent.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. As will be appreciated by those skilled in the art, various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×4, ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to receive and provide a number of signals (e.g., signals 15) from an external device, such as controller 17 or a processor. The controller 17 may include a memory 19 and one or more processors 18. The controller 17 may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., READ command, WRITE command, etc.) are typically entered on the positive edges of the clock signal and data is transmitted or received on both the positive and negative clock edges.

The clock input circuit 20 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as READ commands, WRITE commands, mode-register set commands, activate commands, etc., and provide access to a particular memory bank 12 corresponding to the command, via the bus path 40. As will be appreciated, the memory device 10 may include various other decoders, such as row decoders and column decoders, pumped power supplies and regulated power supplies to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12 as wells as various generated supplies to support these operations. One of these regulated supplies, VARY 28, sets the voltage level at which memory bits of memory bank 12 are operated upon. The voltage regulator may include a SpreadAmp style power amplifier, as described in greater detail below.

The memory device 10 executes operations, such as READ commands and WRITE commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 21 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a WRITE command) or by the memory device 10 (e.g., for a READ command). For READ commands, the DQS signals are effectively additional data output (DQ) signals with a predetermined pattern with preambles and postambles. For WRITE commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance. The DQS signals provide capture timing for DQ data and have a partial tree, flyby topography for the lower byte input capture region 24 and the upper byte input capture region 25. DQS timing consistency is critical and may have a separate regulated voltage supply, VDQS, to isolate the DQS tree from other die demand induced variations. The voltage regulator may include a SpreadAmp style power amplifier, as described in detail below.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), pumped power supplies (to obtain higher than supplied voltages), regulated power supplies such as VARY and VDQS (to provide other specific voltages and isolation benefits), mode registers (to define various modes of programmable operations and configurations), read/write amplifiers (to amplify signals during read/WRITE operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
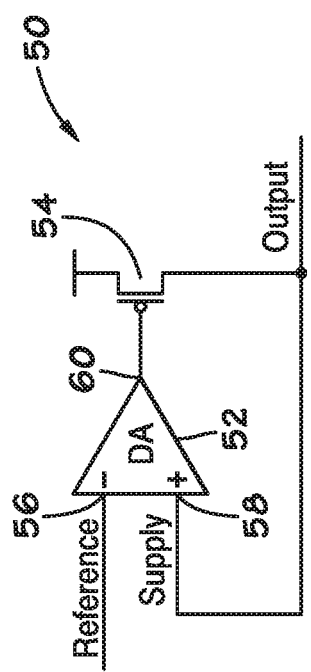
FIG. 2 is a schematic diagram of a conventional power amplifier.

As discussed above, memory devices, such as DDR5 SDRAM devices, may utilize one or more power amplifiers to increase the power capability and regulate one or more internal signals used within the memory device, such as voltage signals. For instance, power amplifiers may be included in one or more components of the memory device 10, such as in the memory banks 12 for VARY or in lower and upper-byte capture regions 24 and 25. Referring briefly to FIG. 2, an example of a common power amplifier 50 is illustrated. As illustrated, the power amplifier 50 includes a differential amplifier 52 and a final driver 54. As will be appreciated, the differential amplifier (DA) 52 receives two signals at inputs 56 and 58, such as analog input signals, and amplifies the difference between the two signals to produce an amplified output signal at the output 60, such as an analog output signal. As illustrated, a reference signal, such as a reference voltage, is received at the input 56 and the output signal from the final driver 54 if fed-back to the input 58 as the supply signal, such as a supply voltage. The single analog output signal of the DA 52 is used to control the final driver 54 to impose regulation of the Output Supply node. As illustrated, the final driver 54 is a p-channel MOSFET device. However, additional or alternative semiconductor devices may be employed in the final driver stage, as will be appreciated by those skilled in the art.

As will be appreciated, in the case of a simple power amplifier (e.g., power amplifier 50), when the load current is applied (i.e., the devices receiving the supply signal, such as a supply voltage, are activated), there is generally a temporary voltage dip in the supply voltage (here, at input 58). The final driver 54 supplies added drive current to counter the load's pulling down of the voltage, but the initial voltage dip can be problematic. In regulating the supply voltage, the voltage dip response, current overhead, power supply noise rejection and overall stability are some of the operational characteristics that impact the functionality and efficiency of the device. The voltage dip response of the Supply signal can be improved by increased overhead current or increased supply capacitance at a reasonable resistance. However, as discussed above, increasing the overhead current will impact overall power of the device and increasing the supply capacitance generally increases the high frequency area used to provide for such increases. Accordingly, an improved power amplifier that maintains or improves the supply (Reference) voltage dip response at lower overhead current and without increasing high frequency areas is generally desirable, particularly for signals where variability can be particularly problematic to device functionality.

Figure 3:
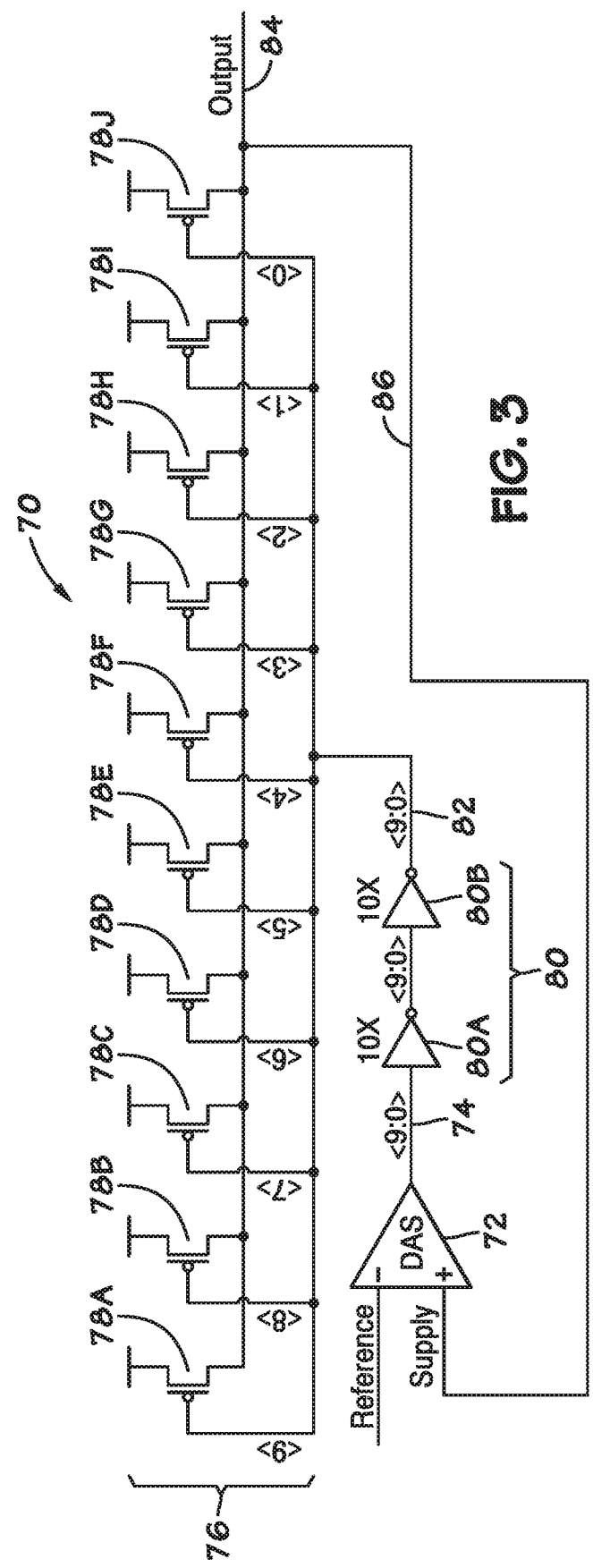
FIG. 3 is a simplified schematic diagram of a spread power amplifier (SpreadAmp) having a spread of graded outputs in accordance with an embodiment.

Turning now to FIG. 3, an improved power amplifier design that may be employed in the memory device 10 is illustrated, in accordance with embodiments of the present invention. Specifically, a simplified embodiment of a SpreadAmp 70 having multiple graded analog outputs is illustrated. In contrast to the standard power amplifier 50 of FIG. 2, having a single DA 52 configured to provide a single output signal to a single final driver 54, the SpreadAmp 70 includes a differential amplifier spread (DAS) 72 configured to provide multiple outputs 74 to a corresponding number of final drivers in a final driver stage 76. In the illustrated example, 10 graded outputs <9:0> 74 are provided at the output of the DAS 72, where each graded output 74 is provided to a respective final driver 78A-78J (also referred to generally as final drivers 78). As will be appreciated, more or less graded outputs may be utilized, depending on various design considerations. For instance, while a greater number of indexes (graded outputs) may increase control and provide more precise drive capabilities, the increased number of indexes may increase complexity and utilize more space on the chip.

As will be described in detail with regard to FIG. 4, the graded outputs are provided by the DAS 72 by combining different differential pair controlled mirror legs having different strengths to obtain different output levels in response to that differential pair's inputs at the frontend of the SpreadAmp 70. The graded outputs <9:0> 74 (or "spread outputs") are digitized and buffered by a gate chain 80 where other gating inputs can be applied. As will be appreciated, the gate chain 80 may advantageously provide protection against channel hot carrier (CHC) degradation. The illustrated gate chain 80 includes two inverters, namely a digitizing inverter 80A and a buffering inverter 80B. However, more or less inverters 80A and 80B may be provided in the gate chain 80 while keeping in mind that more propagation delay can complicate stability. Accordingly, in the presently described example having 10 graded outputs <9:0>, the SpreadAmp 70 includes 10 gate chains 80, each providing a digital output 82 to a respective final driver 78A-78J of the final driver stage. As will be described further below, additional logic gating may also be included in the final driver path along with the gate chain 80 to provide additional benefits. The gate chain 80 and any additional logic gating in the final driver path may provide near instant-on final drive, reconfiguration of final drive transistors used, and/or combining with memory elements for increasing effective final driver resolution and control without increasing the graded output counts.

Further, while the embodiments described below utilize a SpreadAmp 70 having a DAS 72, alternatively, the SpreadAmp 70 may utilize a typical differential amplifier, such as the DA 52 described with reference to FIG. 2. That is, to simplify the analog region, the SpreadAmp 70 may include a DA 52, in place of the DAS 72. As described above, the DA 52 will provide a single output to the gate chain 80. Each digitization stage of the gate chain 80 has a slightly shifted conversion threshold to achieve the graded outputs 82 that will be provided to the final driver stage 76, described further below.

The digital outputs 82 from the gate chain 80 are provided to the final driver stage 76 of the SpreadAmp 70. Specifically, each of the 10 digital outputs 82 from each respective gate chain 80 on the individual output paths are used to drive a respective final driver 78A-78J. In the illustrated embodiment, each final driver 78 is a p-channel MOSFET device. However, additional or alternative semiconductor devices may be employed in the final driver stage 76. The spread of digitized outputs 82 allows approximation of analog while benefiting from the high gain fan-out and transmission of digital control. Further, because there is a spread of various analog outputs 74 and corresponding digital outputs 82, the individual final drivers 78 controlled by their respective digital outputs 82 can be individually tailored to achieve various index progressive characteristics such as linear progression, multiplicative progressions, and other various non-linear progressions in drive strength and resultant turn-on as experienced at summation output node 84. For instance, the final drivers 78 of the SpreadAmp 70 can have their sizes tailored to change overall turn-on characteristics of the final drivers 78 and provide non-linear overall turn-on. Benefits of non-linear overall turn-on include softer initial index turn-on and more resolution of indexes near the operating demand across corners. As determined in modeling examples, making successive final driver sizes a multiple of the first index's size had improved performance compared to making the driver size a multiple of the prior index's size. This can be application/goal dependent.

As illustrated, the drains of each of the PCH devices 78A-78J are shorted together to provide a single controlled voltage node 84 that is the provided as a single voltage output of the SpreadAmp 70. In addition, the single voltage output from the SpreadAmp 70 is also provided as a supply signal voltage to the DAS 72 by including a feedback path 86 between the controlled voltage node 84 and the input of the DAS 72 for comparison to the reference voltage, as previously described.

Figure 4:
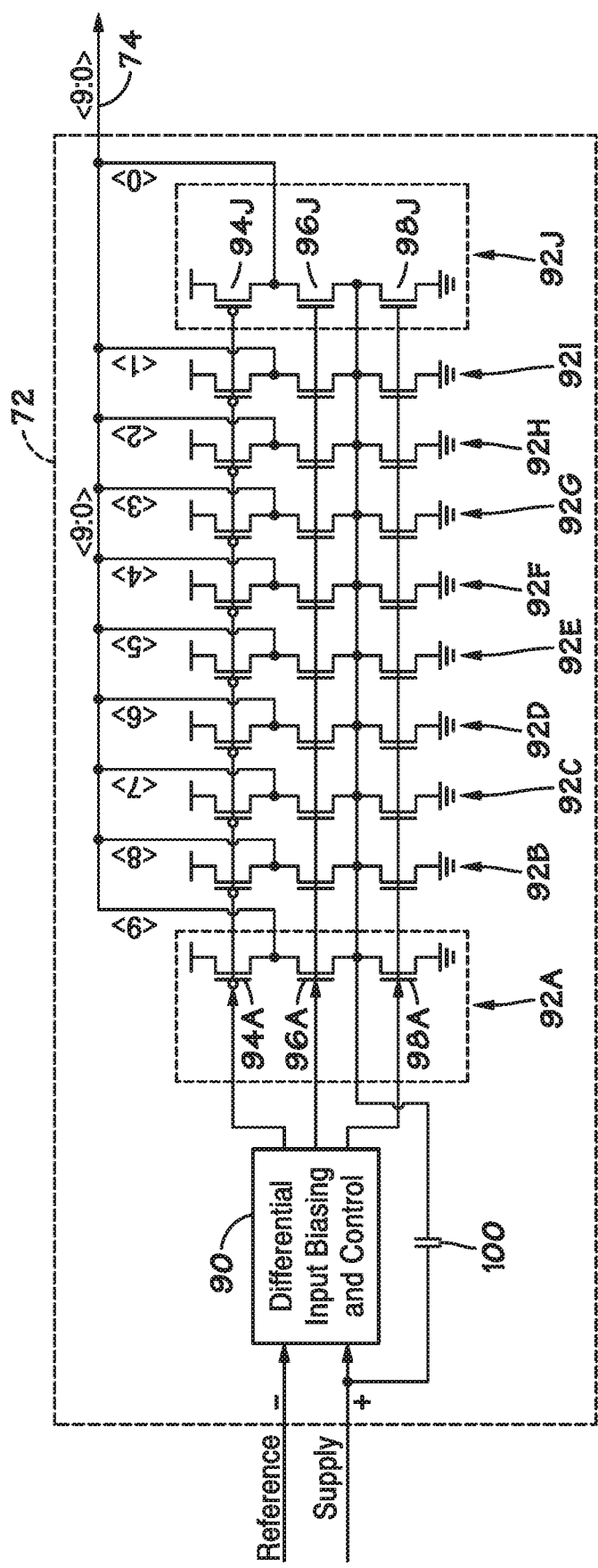
FIG. 4 is a simplified schematic diagram of a spread differential amplifier (DAS) that may be used in the SpreadAmp of FIG. 3, in accordance with an embodiment.

FIG. 4 illustrates one embodiment of the DAS 72 of FIG. 3. As previously described, the DAS 72 receives a reference signal (e.g., reference voltage signal) and a supply signal (e.g., supply voltage signal) that is a feedback signal in the illustrated embodiment. The DAS 72 may include a differential input biasing and control block 90. Specifically, the biasing and control block 90 includes circuitry to provide analog control and proper biasing of the differential input signals received by the DAS 72, as will be appreciated by those skilled in the art.

In addition, to generate the graded indexes to produce the various graded analog outputs 74, the DAS 72 includes a number of cascodes 92. In the illustrated example, 10 graded outputs <9:0> 74 are provided at the output of the DAS 72, where each graded output 74 is provided by a respective cascode 92A-92J. As will be appreciated, each cascode 92 has a common compensation node tied to stability compensation capacitor 100. This compensation technique may be advantageous in that it is less attenuating of the desired output signal path through the output 74 while still providing compensation. This cascode technique may be advantageously applied to the SpreadAmp 70. Compared to an n-channel MOSFET (NCH) device, a two series NCH device cascode may advantageously provide more ideal current source like characteristics.

In the illustrated embodiment of FIG. 4, each cascode 92 includes a p-channel MOSFET (PCH) device 94 and two n-channel MOSFET (NCH) devices 96 and 98 coupled in series. For example, the cascode 92A includes a PCH device 94A and two NCH devices 96A and 98A. Likewise, the cascode 92J includes a PCH device 94J and two NCH devices 96J and 98J. For clarity of illustration, the reference numerals for the individual elements of each cascode 92B-92I have been omitted in FIG. 4. However, it should be understood that each cascode 92A-92J is similarly configured. The illustrated design of each cascode 92 may provide a more isolated way to provide capacitive feedback compensation.

In accordance with the present embodiment, each cascode 92A-92J has a different P/N controlling ratio. That is, the transistor widths of each PCH device 94 and each NCH device 96 and 98 is varied from one cascode 92 to another. That is to say, the transistor widths of the devices 94, 96, 98, and thus the P/N controlling ratio, of cascode 92A is different from that of cascode 92B, which is different from that of cascode 92C, and so forth. For instance, the PCH device 94A may be 7.5 um wide, with the NCH devices 96A and 98A being 9 um wide with these widths progressively increased such that the PCH device 94J gets to 10.2 un wide while the NCH devices 96J and 98J stay at 9 um wide. Alternatively, the P/N ratio could be varied for both the PCH and NCH device widths across the cascodes. By providing multiple cascode current mirrors as in FIG. 4 and varying the strength ratios of the PCH devices 94 and NCH devices 96, 98 across indexes, the gradings of analog outputs 74 are generated respectively, by each cascode 92A-92J. To reduce current, the drive strength of each cascode 92 is reduced since subsequent digitization is a small load compared to a final driver load of a standard power amplifier. As illustrated, the DAS 72 may also include a capacitor or transistor configured capacitor 100. As mentioned earlier, the capacitor 100 is used for stability compensation.

The illustrated embodiment in FIG. 4 show changing P/N ratios of the cascodes 92 just prior to digitization for generating the spread of graded outputs 74. However, as will be understood, alternative designs may be employed to provide a spread of graded outputs, effectively. For example, instead of multiple graded cascodes each driving a separate digitization stage, one large cascode could be employed. For instance, one large cascode could drive multiple digitization paths, each path having differing P/N ratios across paths in one stage per path or in a series of stages per path to give the effective grading effect. Alternatively, a large cascode could have embedded resistive series elements in the form of resistors or transistors providing tap points along the resistive series path where separate digitization inputs tap, again providing an effective grading of outputs. A large cascode could also be designed to have attached multiple small differential comparators, each with differing references to induce the effective grading. In another alternative, multiple smaller power amplifiers could be utilized, each with a shifted reference to provide the spread of graded outputs from the set. Still further, a combination of graded cascodes, each driving a number of sub-graded digitization paths to form an overall effective grading of outputs, could be envisioned. In this alternative, the cascode gradings should be course enough such that sub-gradings wouldn't overlap each other.

Various embodiments of the SpreadAmp 70 may be employed to improve power amplification and control of various power signals within the memory device 10. For instance, for DDR5 SDRAMS, certain static power rails may be utilized internally to the memory device 10. Various power rails may benefit from utilizing embodiments of the SpreadAmp 70, as described above and as described in greater detail below. As will be appreciated, while specific examples of power signals that may be implemented within the memory device 10 and may employ embodiments of the SpreadAmp 70, various other power signals may employ embodiments of the SpreadAmp 70, in accordance with the present techniques. Accordingly, the specific signals described herein and the various embodiments described are merely examples.

Two static power rails or power supplies that may be utilized in the memory device 10, such as a DDR5 SDRAM device, are VDQS and VARY. As will be appreciated, VDQS is generally provided by an internal (on-die) regulator and is tightly controlled to be a "clean" power supply. The VDQS is generally dedicated for use in the Write Path and thus is utilized in conjunction with the write clock tree. As discussed above, less signal variation in the Write Path is generally beneficial to operation of the memory device 10. By reducing the noise of the VDQS, less signal variation in the Write Path will be exhibited. As such, utilizing the SpreadAmp 70 for amplification of the VDQS signal may be beneficial. Examples of implementing the SpreadAmp 70 in conjunction with the VDQS signal will be described below with regard to FIGS. 5-8.

Another power signal that is internally regulated within the memory device 10 is VARY. As appreciated, VARY is generally dedicated to usage in the memory array of the memory device 10. VARY is generally used to keep the high-peak use by the memory array during row activation isolated from the peripheral logic of the memory device 10, as well as to provide a lower voltage to reduce memory bit stress effects. The separation of the power signal for use in the memory array, as opposed to the periphery, (i.e., dedicated usage of VARY for the memory array) is typically beneficial because the high-peak usage during row activation of the memory array may create a lot of noise dips on the supply. As such, to reduce the noise, the SpreadAmp 70 may be useful in regulating VARY. Examples of implementing the SpreadAmp 70 in conjunction with the VARY signal will be described below with regard to FIGS. 9 and 10.

Figure 5:
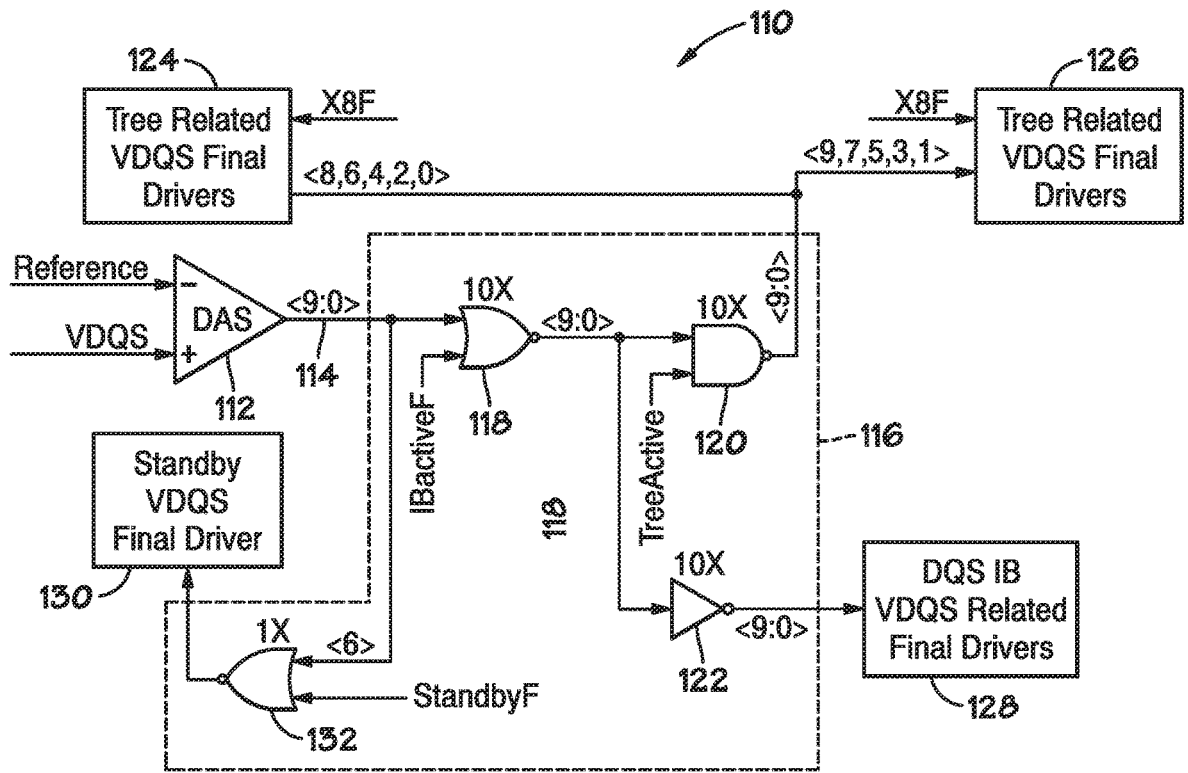
FIG. 5 is a simplified schematic diagram of another SpreadAmp that may be used to regulate a write clock tree using the VDQS signal, in accordance with another embodiment.

Referring now to FIG. 5, an embodiment of the SpreadAmp 70 employed for VDQS regulation is illustrated. Specifically, the SpreadAmp 110 is used to regulate the write clock tree using the VDQS signal to reduce the input clock tree timing variation for data capture through supply regulation (i.e., supply VDQS). As previously described, the SpreadAmp 110 includes a DAS 112 which receives the VDQS signal, along with a reference signal and produces a number of graded analog outputs <9:0> 114 (or "spread outputs") that are subsequently digitized and buffered by gating circuitry 116. In the illustrated embodiment, the gating circuitry includes a set of NOR gates 118, a set of NAND gates 120 and a set of inverters 122. As will be appreciated the number of NOR gates 118, NAND gates 120 and inverters 122 corresponds to the number of graded analog outputs 114, or in this case 10. As previously described, the gating circuitry 116 is used to digitize and control the graded analog outputs 114. Further, in the presently described application, the gating circuitry 116 will provide proper timing and activation of the clock timing tree and the associated drivers.

In the depicted VDQS regulation implementation of the SpreadAmp 110, a number of final driver stages are provided. Advantageously, the final driver stages are broken into groups to align with load phasing and configuration. Specifically, the clock tree for the DQS supports two final driver stages 124 and 126 for separate control of the odd and even graded analog outputs. For instance, the final driver stage 124 includes final drivers configured to receive graded analog outputs <8, 6, 4, 2, 0> while the final driver stage 126 includes final drivers configured to receive graded analog outputs <9, 7, 5, 3, 1>. Each clock tree-related final driver stage 124 and 126 also receives a control signal X8F to enable either a X4 or X8 mode of operation. The gating circuitry 116 is included in the digitization and buffering stages to service these load phase timings. In addition to the clock tree-related final driver stages 124 and 126 relating to VDQS, a final driver stage 128 is employed for the DQS Input Buffers (IB). As illustrated, the TreeActive signal is used to activate the tree-related final driver stages 124 and 126, while the IBactiveF signal is used to activate the DQS IB related final driver stage 128. As previously described with regard to the final driver stage 76 of FIG. 3, the final driver stages 124, 126 and 128 may include one p-channel device (e.g., transistor), per input received, to provide a final driver for each signal, in accordance with one embodiment.

The SpreadAmp 110 also includes a standby final driver stage 130 for preconditioning of the DAS 112 so that the DAS 112 is preconditioned in standby mode to target a slightly lower voltage than normal operation under loaded conditions. For instance, DAS 112 also receives StandbyF (not illustrated) and does internal reference shifting during standby to affect this lower standby operating point. This slightly lower operating point preconditioning effect helps insure that the DAS 112 is fully engaged immediately during normal operation. In the present example, the standby final driver stage 130 may be activated by StandbyF, where a NOR gate 132 provides the graded output 114, corresponding to index <6>. Selecting an index near the middle of the available indexes during standby provides another preconditioning aspect. That is, during standby mode, the DAS 112 targets analog index <6> (i.e., graded analog output <6>) to precondition the SpreadAmp 110 for active mode such that it is approximately in the middle of the active mode drive capability of the SpreadAmp 110. When IBActiveF is asserted, it is very close to the amount expected in terms of indexes needed to support the input buffers (IB) demand. Thus, when TreeActive is asserted, there is no wait for index <0>, <1>, <2>, etc. to be received.

Final drivers 124, 126 and 128 are sized specific to their incremental load type expected such that a metered amount of drive that is proportional to the expected load for the IB or the write clock tree may be provided. As appreciated, the normal operation flow provides a transition from standby mode to active mode and thus provides a progression from activating the IB final driver stage 128 to activating the tree-related final driver stages 124, 126. It may be important that the IB turns on (via the final driver stage 128) before the write clock tree turns on, because the IB is essentially analog at the front end. Thus, some stabilization time is typically beneficial before activing the write clock tree (via the final driver stages 124, 126). The IB active path allows subsequent enablement of the final driver stages 124, 126 at the proper time via the TreeActive control signal. Since the standby and active states are regulated by the same DAS 112, active and standby transition timings may be reduced compared to utilizing separate power amplifiers for each of the active and standby modes as in prior designs. Further, by avoiding analog connections to the final driver stages 124 and 126, the load intensive final drivers 124 and 126 can be coupled to a separate noisy supply without stability concerns, while the DAS 112 and digitization stages may remain on a quiet supply.

Figure 6:
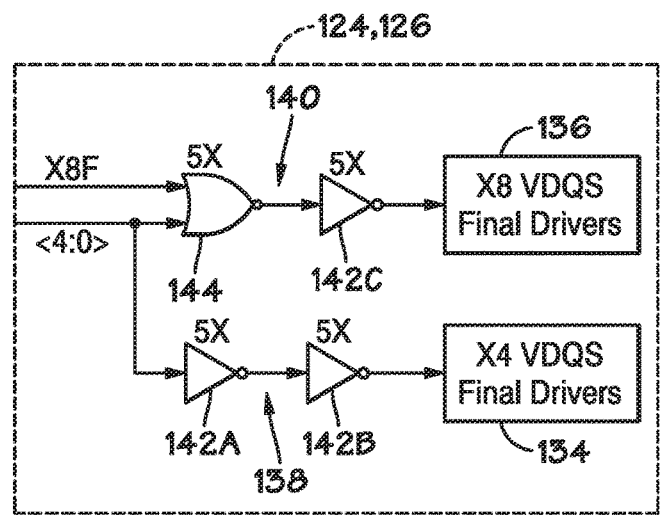
FIG. 6 a simplified schematic diagram of an example of the VDQS final driver stages of FIG. 5, in accordance with an embodiment.

FIG. 6 illustrates an example of a write tree-related final driver stage 124, 126 that may be employed in the present SpreadAmp 110. In the illustrated embodiment, the final driver stages 124 and 126 are configured to allow for utilization with X4 or X8 memory devices. Accordingly, the final driver devices 134 and 136 (e.g., each having 5 p-channel transistors) may be provided on separate digitization and buffering paths 138 and 140, respectively, to enable X4 or X8 modes of operation. As previously described, the digitization and buffering may be provided utilizing inverters 142A-142C in the digitization drive paths 138 and 140. A NOR gate 144 receives the analog outputs 114 (for example, 5 analog outputs 114, as illustrated with regard to FIG. 5) and the X8F enablement signal to allow for control of the X4 or X8 modes of operation.

Figure 7:
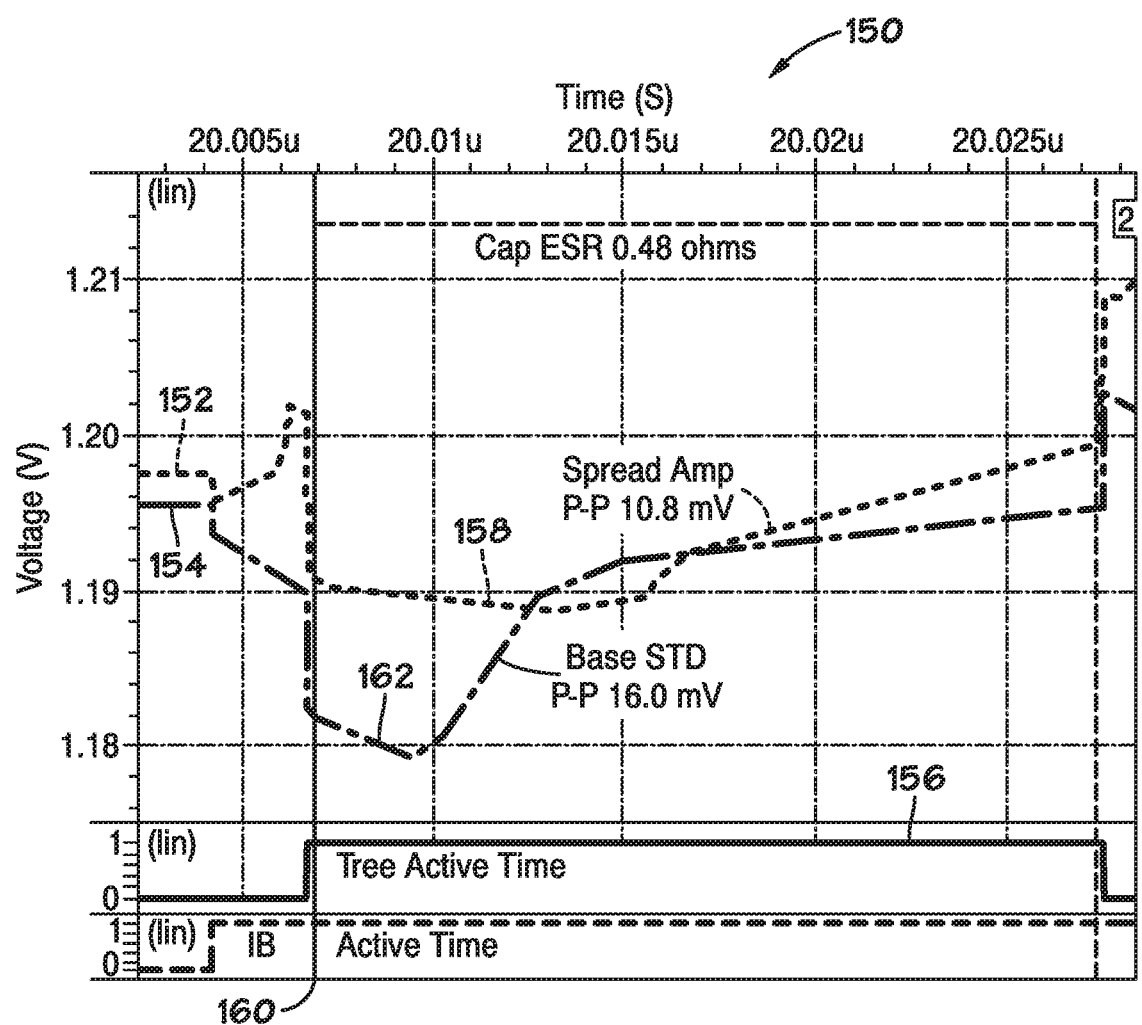
FIG. 7 shows comparative simulation results of a conventional power amplifier and the SpreadAmp of FIG. 5.

FIG. 7 illustrates an example of simulation results 150 for the worst-case regulation of 30 corners to illustrate the improvement of utilizing a SpreadAmp 110 having a DAS 112 configured to provide a spread of analog outputs 114, instead of a standard DA 52 configured to provide a single output 60, as described with regard to FIG. 2. Thus, a VDQS signal 152 simulated using the DAS 112 is compared to a VDQS signal 154 simulated using the DA 52 (FIG. 3). As previously described, voltage regulation of the VDQS supply during write clock tree active time is important to accurate data capture. As simulated, with a 52 pS stressed data eye @ SG4800, (0.25 UI), the goal is to strive for <10 pS supply noise related variation based on a 0.53 ps/mV PSS, for example. This calculates to <19 mV supply noise variation during data capture. In FIG. 7., peak-to-peak (P-P) regulation variation is indicated during the tree active time 156. The SpreadAmp 110 provides a bump up 158 in voltage (preconditioning) just prior to actual tree active time 160. This preconditioning is possible due to leading timings for the generation of the TreeActive signal of FIG. 5 based on prior commands. Advantageously, the preconditioning serves to reduce voltage dip during tree active time. Notably, for an effective series resistance (ESR) of 0.48 ohms for capacitance, the VDQS supply signal 154 utilizing a standard DA 52 experiences a voltage dip 162 which may negatively impact data capture. As indicated, the voltage signal 152 demonstrated a 10.8 mV P-P swing, compared to the voltage signal 154 which demonstrated a 16.0 mV P-P swing (Base STD) during Tree Active Time. As previously described, less voltage swing generally provides better control and more accurate data capture. Due to a shared read and write DQS clock signaling path, a precautionary circuit is employed that also enables TreeActive if prior reads or other inadvertent DQS toggles overlap IB enablement. This avoids contribution to voltage drop during subsequent intended write tree active times. This situation should only occur in a non-write leveled case which is not the normal mode of operation.

While not shown, more extensive write pattern results were achieved employing voltage regulation filtering on actual write clock tree active times to demonstrate improved capability within standard control requirements. Various write gappings and other enablement cases stress VDQS regulation due to large load changes of the write tree enabling and disabling. Another advantageous aspect of the present embodiments demonstrated through simulation, is power amplifier current draw overhead. In previous designs, 6 power amplifiers 50 for a byte may be implemented resulting in current draw overhead that is larger. The current draw for the SpreadAmp 110 is lower due to a single DAS 112 used for a byte. The digitized indexes are transmitted to the final driver stages which can be placed closer to load points. This transmission through metal routing is what results in current peaking during low-to-high index transitions. When compared to X4 mode, there are only 4 power amplifiers 50 enabled. In this case, the SpreadAmp 110 power is ⅙th the current draw overhead. Specifically, utilizing the standard power amplifier 52 design, for an ESR of 0.48 ohms for capacitance over 30 corners, the maximum current draw was 4.1 mA and the median current draw was 2.7 mA. Comparatively, utilizing the SpreadAmp 110 design, the maximum current draw was 0.49 mA and the median current draw was 0.36 mA.

Figure 8:
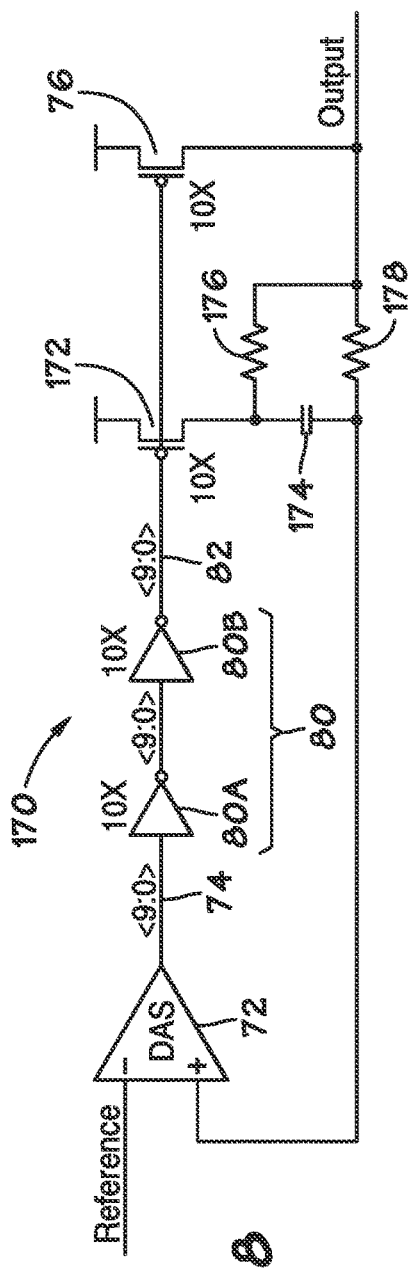
FIG. 8 is a simplified schematic diagram of another SpreadAmp including active feedback, in accordance with another embodiment.

As noted, the simulation and analysis described with regard to FIG. 7 was for an effective series resistance (ESR) of 0.48 ohms for capacitance. With an even lower ESR, additional circuitry can be added to further reduce peak-to-peak noise. To control the voltage to provide less than a 10 mV peak-to-peak voltage swing and thus reduce the variability further, the SpreadAmp 110 should "feel" the digital switches before significant VDQS signal movement occurs. As such, FIG. 8 provides additional circuitry that may be employed in a SpreadAmp to reduce the P-P voltage swing to less than 10 mV, in accordance with embodiments provided herein. Referring back to the simplified SpreadAmp 70 of FIG. 3 for reference, a SpreadAmp 170 is illustrated in FIG. 8. As previously described in FIG. 3, the SpreadAmp 170 includes a DAS 72 configured to provide multiple outputs 74 to a corresponding number of final drivers in a final driver stage 76. In the illustrated example, 10 graded outputs <9:0> 74 are provided at the output of the DAS 72, where each graded output 74 is provided to a respective final driver of the final driver stage 76. Further, the graded analog outputs <9:0> 74 are digitized and buffered by a gate chain 80. The illustrated gate chain 80 includes two inverters, namely a digitizing inverter 80A and a buffering inverter 80B, though other gating elements may also be provided.

In addition, the SpreadAmp 170 includes active feedback added and consisting of a local small replica of final drivers 172 that is capacitively coupled to a partially isolated feedback path via the active feedback capacitor 174. Incorporation of the replica drivers 172 allows digital switches to be felt quickly by amplifying the external conditions to improve controllability. During the active mode, the active feedback capacitor 174 is utilized to capacitively couple the feedback path to the replica of final drivers 172. In standby mode, the active feedback capacitor 174 provides a second function, which is to store an estimate of the load that will be seen upon activation (e.g., when the write clock tree is enabled utilizing VDQS). A trimmable resistance 176 allows for active resistance in the active mode and standby resistance combined with a standby biasing circuit not shown in the load estimation or standby mode, to allow for storage of an initial estimated load condition in the capacitor 174 under biasing current. A small resistance 178 may also be provided in the feedback path. The replica of final drivers 172 reconfigure between active feedback and standby's load estimation modes. When switched to active feedback mode, the capacitor 174 pushes on the feedback node of the DAS 72 due to Active/Standby resistance and baising differences. While staying in this mode, the active feedback capacitor 174 re-levels to the real load level. Advantageously simulations demonstrated tighter control and less variability (less than 10 mV P-P) using the additional circuitry of FIG. 8 in the SpreadAmp 170.

As previously described, another voltage supply employed in the memory device 10 that may benefit from utilization of a SpreadAmp, rather than a traditional power amplifier (e.g., power amplifier 50 of FIG. 2) is the VARY supply signal which is the supply used to restore the memory bit capacitors in the memory device 10. That is, VARY supplies the sense amplifiers that sense each capacitor of each memory cell of the memory banks 12. For instance, in current designs providing for maximum demand configurations (e.g., activating each cell), 128 standard power amplifiers may generally be used for the VARY supply. Advantageously, the same demand can be met with 16 SpreadAmps for VARY, in accordance with embodiments described herein. For instance, during high demand operation, such as during refresh operations, where each cell of each memory bank 12 may be activated, utilizing a SpreadAmp design, rather than standard power amplifier design will advantageously provide power savings and a reduction in amplifier circuitry. In one embodiment, 2 SpreadAmps per 4 bank regions (e.g., memory banks 12 of FIG. 1) with final drivers along the bank ends and some in the row throat interior may be employed.

Figure 9:
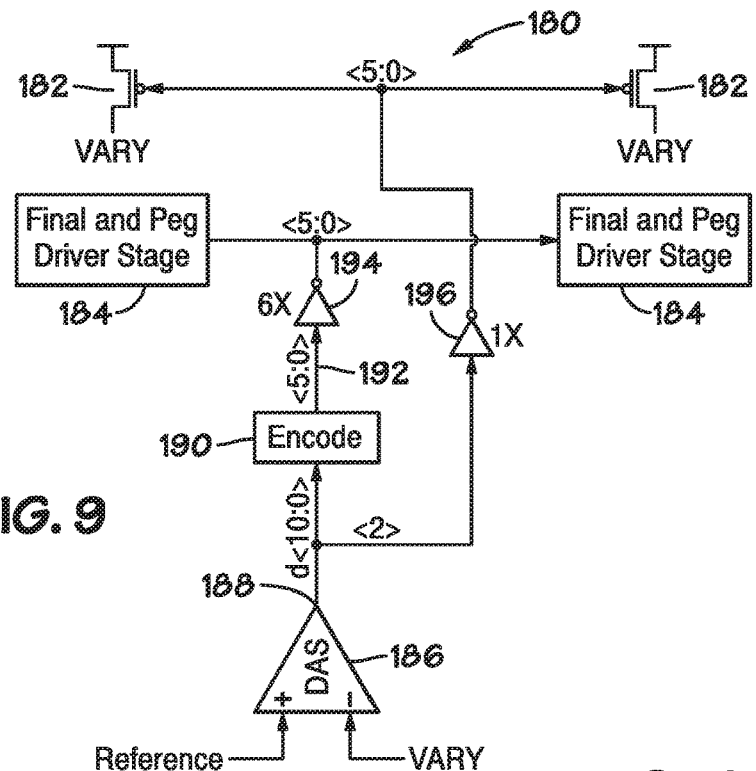
FIG. 9 is a simplified schematic diagram of another SpreadAmp that may be used for VARY regulation, in accordance with another embodiment.

For example, FIG. 9 illustrates a single SpreadAmp 180 with its two interior final drivers 182 (i.e., interior to the memory array, as opposed to the periphery) and two repeated strips of final and peg driver stages 184. The final drivers 182 may be any drive device such as a p-channel transistor. As illustrated, the interior final drivers 182 receive only a single index <2>. Interior final drivers 182 are larger than the final drivers previously described and described further below with regard to the final and peg driver stages 184. The interior final drivers 182 may be located between row decoders of two adjacent memory banks 12, for instance, to provide distributed drive support at the interior. While additional drivers may be added to the memory banks, there may be limited space available to add drivers to the memory banks 12. It should be noted that the single index may be provided by any of the outputs 188 of the DAS 186, and not necessarily index <2>. Further, while multiple indexes could be routed to additional interior final drivers 182, such routing may disadvantageously consume additional power. Accordingly, a balance between additional drive and power consumption may be achieved in accordance with the present SpreadAmp 180. The SpreadAmp 180 also includes a buffer 196 providing the index <2> to the interior final drivers.

The final and peg driver stage 184 will be described further below and is optionally included in the illustrated embodiment to improve the functionality of the SpreadAmp 180, when used to regulate the VARY supply. One embodiment of the final and peg driver stage 184 will be described in more detail below with regard to FIG. 10. As with the previously described SpreadAmps, the SpreadAmp 180, used for VARY regulation, includes a DAS 186. In this case, DAS 186 includes the digitization stage for power savings usage of its outputs within the DAS 186. The DAS 186 will be described in greater detail below, with regard to FIG. 11. Continuing with FIG. 9, to reduce routing (e.g., line count) and thus complexity and sizing in accordance with one embodiment, the digitized outputs d<10:0> 188 of the DAS 186 are encoded, using an encoder 190, to reduce the number of routes from 11 digital output signals d<10:0> 188 down to 6 digital output <5:0> signals 192. As will be described, the $11^{th}$ digital output <10> is used to activate additional drivers (peg drivers) to provide additional drive power without the need for additional indexing from the DAS 186. As used herein, the peg driver indicator bit (here index <10>) will refer to the index used to determine whether maximum final driver capability has been reached. When the final index <10> is enabled, it will indicate that all previous indexes are also enabled and thus if index <10> is activated, peg drivers may advantageously be enabled.

The SpreadAmp 180 further includes a buffer 194 corresponding to each of the encoded digital outputs 192. The encoding and subsequent decoding method have been demonstrated to be robust and glitch error-resistant during simulation testing. As will be appreciated, additional decoding may be employed to further reduce line count in certain embodiments.

To improve operation during the VARY implementation, peg drive component of final and peg driver stages 184 are added to the SpreadAmp 180 to detect when all indexes (output signals 188 from the DAS 186) are on and start enabling additional drive, as needed. That is, when all final drivers are on and thus the final drive stage is maxed out or "pegged" (i.e., max power is reached utilizing the final drivers), additional drivers ("peg" drivers) can be added through the peg driver stages 184, utilizing the peg driver indicator bit. The additional drivers (e.g., drive transistors) in the peg driver stage 184 may be sequentially added, as needed, until the maximum index final driver device is disabled, or all peg drive devices in the peg driver stage 184 are enabled. Thus, each peg drive device (e.g., drive transistor) of the peg driver 184 is associated with a final driver index. As will be discussed, each final drive and peg driver stage 184 includes final drivers configured to receive each of the spread outputs from the DAS 186, as described in previous embodiments.

Figure 10:
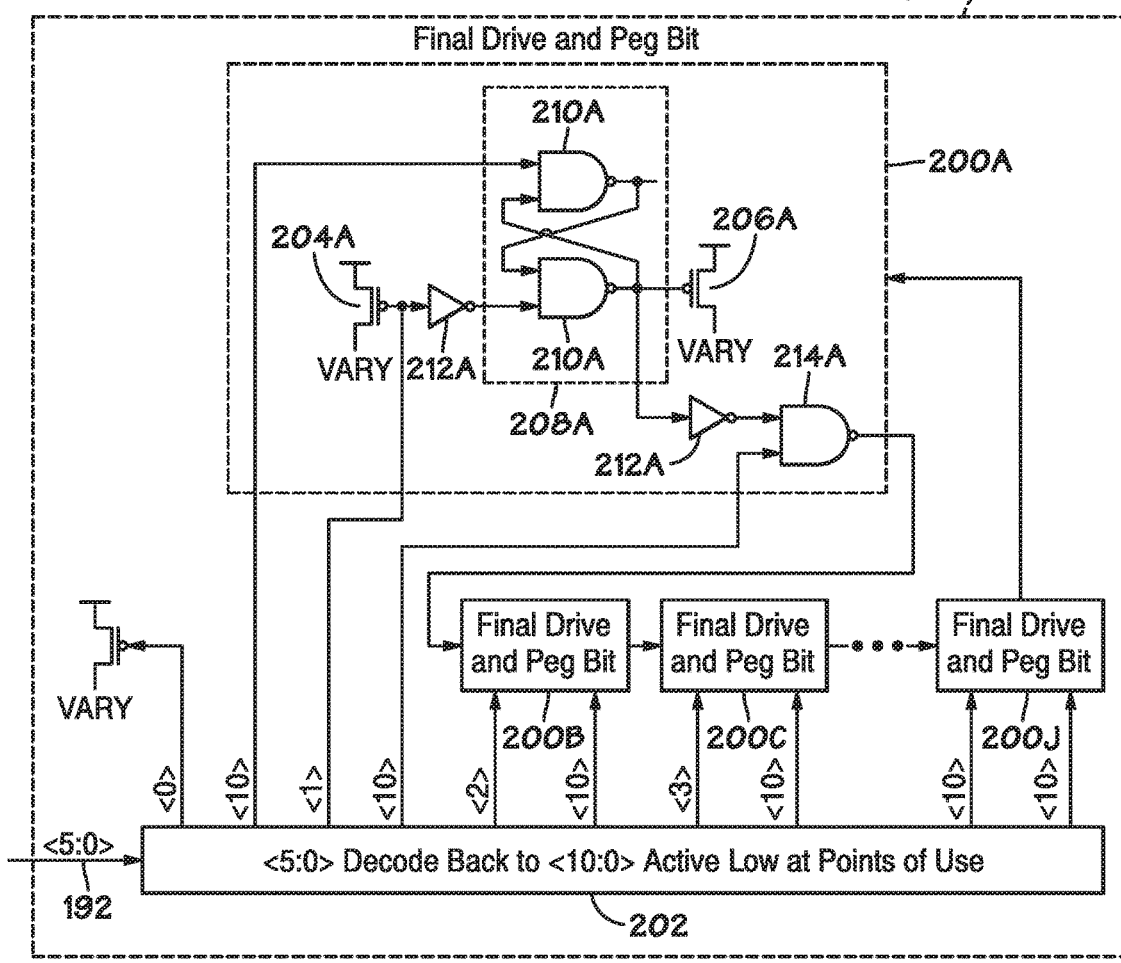
FIG. 10 is a simplified schematic diagram of an example of the final and peg driver stage of FIG. 9, in accordance with an embodiment.

Referring to FIG. 10, one embodiment of the final and peg driver stage 184 is illustrated. The final and peg driver stage 184 includes one final drive and peg bit block 200 for each of 10 digitized output bits 188. Specifically, the final and peg driver stage 184 includes final drive and peg bit blocks 200A-200J. As previously described, the final and peg driver stage 184 also includes decode circuitry 202 configured to decode the 6 digital output signals <5:0> 192 received at the final and peg driver 184 to provide the decoded digital output bits corresponding to the digitized output d<10:0> 188. Each final drive and peg bit block 200 includes a number of elements. For illustrative purposes, one final drive and peg bit block 200A is provided in detail. As will be appreciated, the remaining final drive and peg bits 200B-200J will include like elements.

As illustrated, the final drive and peg bit block 200A includes a final driver 204A (e.g., a p-channel transistor) and a peg driver 206A (e.g., a p-channel transistor). Each final driver 204A may be similar to the final drivers 78A-78J, described above with regard to FIG. 3. In addition, to provide for operation and inclusion of the peg driver 206A as needed, the final drive and peg bit block 200A includes an SR latch 208A, including two NAND gates 210A. As described below, the SR latch 208A allows for detection of maximum final driver power and activation of additional peg drivers 206A is such a condition is detected. The final drive and peg bit block 200A may also include buffers 212A. Generally, disablement of a given final driver index also disables its associated peg driver 206 if it was enabled. This provides a way for added drive resolution without increasing the number of indexes from the DAS 186, as well as maintaining index control of all drivers. More specifically, during operation, each final drive and peg bit block 200 receives a digital bit corresponding to a single index (i.e., the spread digital output 188) used to activate the corresponding final driver 204, as previously described. In addition, each final drive and peg bit block 200 receives a digital bit corresponding to an indication of whether maximum drive capability has been reached for the final drivers 204 (i.e., the peg driver indicator bit) and thus provides an indication that the peg drivers 206 should be enabled in a sequentially delayed fashion. While the instant embodiment uses a single loop of peg drives, more loops of peg drive could be sequentially added for even more resolution capability.

For instance, the final drive and peg bit block 200A receives a digital output <1> 188 to activate the final driver 204A and the peg driver indicator bit <10> to detect whether additional peg drive is needed. The detection is performed using a NAND latch 208A, for instance. The continued propagation of the pegged state is through NAND gate 214A, for instance. This sequential enablement rather than parallel simultaneous enablement of all peg drivers 206 gives DAS 186 time to respond and limit further peg drive enablement or even reduce it if necessary. If index <10> is enabled and also index <1> is enabled (both active low), the memory cell/latch to set and the peg drive 206A can be turned on to provide additional drive power, since enablement of the index <10> will also indicate that all prior indexes (and corresponding final drivers 204) are also enabled. As long as index <10> remains set, the SpreadAmp 180 is "pegged out" and the next stage (i.e., the next final drive and peg bit block 200B-200J) is enabled in the same manner. As long as the corresponding lower index is still active low, the circuit is kept from resetting (i.e., sequentially turning on more and more peg drives 206). Once index <10> is no longer active, the drive power is no longer maxed out, which stops the peg drive 206 from continuing to propagate to add additional stages and the peg drivers 206 can be turned off as dependent on disablement of indexes. If for instance, all peg drive was eventually enabled, and the final drive falls below the peg drive, the index <10> transitions high, and the SR latch 208A of 200J transitions into a reset mode and turns off its peg drive 206A of 200J, thereby resetting the SR latch 208A and the peg drive 206A for the associated bit (here, index <10>). If drive requirements drop further, more indexes may be disabled, disabling both their corresponding final and peg drivers. Generally, as the final drive drops below the peg drive, it begins to shut off the peg drive. Conversely, if the final drive does not drop lower than the peg drive and continues back up, the final drive continues to re-enable. As will be appreciated, one benefit of this embodiment, incorporating peg driver capability into the SpreadAmp 180, is that it allows more resolution of drive without having to create more indexes coming out of the SpreadAmp 180.

During simulations of VARY regulation utilizing the SpreadAmp 180, the VARY power amplifier current overheads for maximum power use were demonstrated to be favorable. Average power amplifier current during refresh all-banks (REFab) using the SpreadAmp 180 (compared to a conventional power amplifier 50) were determined to be lower. For instance, when 16 conventional power amplifiers 50 (FIG. 2) were employed in simulations (e.g., for a REFab operation), a maximum current draw of 10.1 mA and a median current draw of 7.1 mA was achieved for a 4 bank region. For the same 4 bank region, only 2 SpreadAmps 180 are required. Simulations showed a maximum current draw of 1.02 mA and a median current draw of 0.75 mA was achieved during REFab. Standby current comparison showed improved results for SpreadAmps 180 when compared to conventional power amplifiers 50, as well, although less remarkable since both are in the microamp range.

Figure 11:
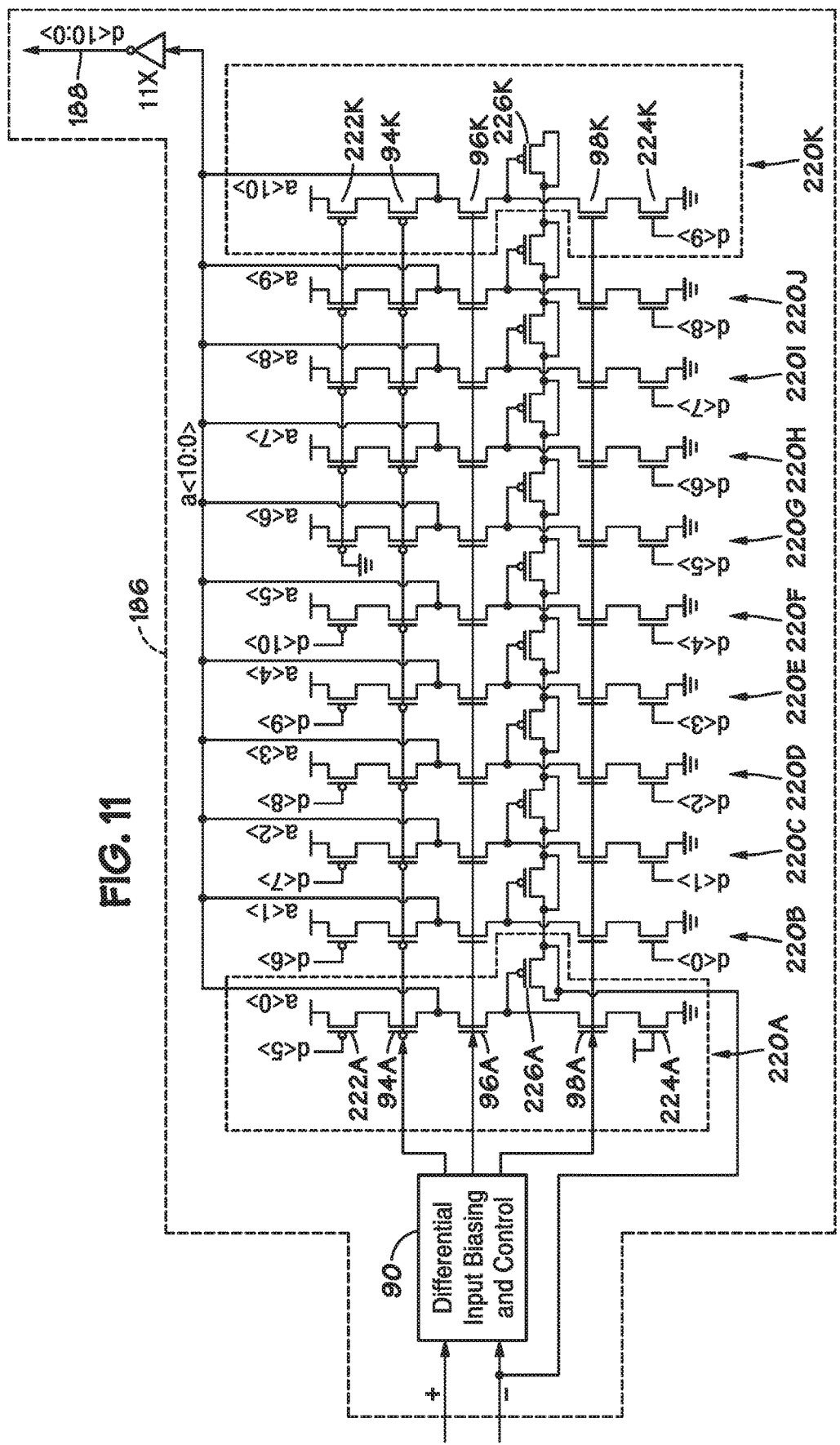
FIG. 11 is a simplified schematic diagram of an example of the DAS of FIG. 9, in accordance with an embodiment.

FIG. 11 illustrates an embodiment of the DAS 186 employed in the SpreadAmp 180. While the concept behind the SpreadAmp 180 is generally similar to the description of the SpreadAmp 70 in FIG. 3 (i.e., to provide multiple graded outputs), implementation of the SpreadAmp 180 for VARY regulation, for example, provides additional considerations based specifically on the usage and function of VARY. In accordance with the disclosed embodiment of the SpreadAmp 180 for use in VARY regulation, the DAS 186 employed in the SpreadAmp 180 was designed to save current draw overhead. While the illustrated design of the DAS 186 provides power savings, 10 mV-20 mV of additional noise may be added by the disclosed design. Because the increase in noise has less impact on VARY (compared to VDQS, for instance), the inclusion of the design is intended as one example. Those skilled in the art will understand the various tradeoffs (e.g., power savings versus noise) in considering implementation of such designs.

As with the DAS 72, the DAS 186 may include a differential input biasing and control block 90. Specifically, the biasing and control block 90 includes circuitry to provide analog control and proper biasing of the differential input signals received by the DAS 186. In addition, to generate the graded indexes to produce the various graded digital outputs 188, the DAS 186 includes a number of current mirror cascodes 220. In the illustrated example, 11 graded digital outputs <10:0> 188 are provided at the output of the DAS 186, where each graded output 188 is provided by a respective cascode 220A-220K. As in the DAS 72, in the DAS 186, each cascode 220 includes a p-channel MOSFET (PCH) device 94 and two n-channel MOSFET (NCH) devices 96 and 98. For example, the cascode 220A includes a PCH device 94A and two NCH devices 96A and 98A. Likewise, the cascode 220K includes a PCH device 94K and two NCH devices 96K and 98K. In accordance with the present embodiment, each cascode 220A-220K has a different P/N controlling ratio. That is, the transistor widths of each PCH device 94 and/or each NCH device 96 and 98 is varied from one cascode 220 to another to provide the graded outputs 188.

However, in addition to the elements described with regard to the DAS 72, the current mirror cascodes 220A-220K of the DAS 186 include header enable transistors 222 and footer enable transistors 224 added to each cascode 220 to provide overall power savings. For example, the current mirror cascode 220A includes header enable transistor 222A and footer enable transistors 224A. Likewise, the current mirror cascode 220K includes header enable transistor 222K and footer enable transistors 224K. In the present embodiment, the head enable transistors 222 may be p-channel transistors, while the footer enable transistors 224 may be n-channel transistors. In addition, rather than including a common capacitive feedback node, as in the DAS 72, the capacitive feedback in the DAS 186 includes discrete capacitive feedback in each cascode 220 using corresponding discrete capacitive elements 226. This configuration allows cascodes 220A-220K to be selectively disabled. The digitized states of the digitized outputs d<10:0> 188 aid in the disablement and enablement. The next higher index cascode 220 is only enabled if the present cascode's d<n> index is high, where n is the index <10:0> corresponding to each respective cascode 220A-220K. As higher indexes are enabled, cascodes that are 5 indexes lower will be disabled in a way to keep its d<n> index high. As will be appreciated, each capacitive element 226 may be a transistor configured to be used as a capacitor. In this process, large capacitors are created using paralleled memory bit cells. Due to manufacturability issues, these capacitors should be a certain size or larger. For this reason, they are generally too large for this discretized application, and transistors configured as capacitors are sufficient while keeping the circuit size reasonable. Conversely, trying to achieve large capacitors with transistors configured as capacitors may be inefficient.

The presently described embodiment can be considered a "window" that slides along to enable and disable cascodes 220, rather than turning them all on. For instance, if index d<5> is not on, which keeps the p-channel on, index d<0> goes active high and turns on (enables) the next stage so it is ready to draw current to enable the next cascode 220 to turn on. As more cascodes 220 are needed, the cascodes 220 are sequentially enabled, so each cascode 220A-220K needs to be enabled first before implementing another (next) cascode 220A-220K. Once an index has been enabled, looking backwards (e.g., index <5> corresponding to cascode 220G is on, but index <6>, corresponding to cascode 220H is not yet on, the corresponding footer enable transistors 224 can be used to shut off earlier cascodes 220 to minimize the number of cascodes 220 drawing current. By biasing a number of legs (here 5 at a time), the cascodes 220 are ready to respond immediately, without waiting for the header enable transistor 222 to be biased, which provides better control. From a stability viewpoint, it has been observed that impeding upward progression of d<n> index turn-on somewhat is acceptable while it may be advantageous to give more room for quicker d<n> index turn off. This is the reason behind the skew in leading and trailing cascode enablements, as will be appreciated.

Embodiments of the disclosed SpreadAmp can be employed in other, more general applications, as well. For instance, as known in the art, Class B power amplifiers provide advantages over Class A power amplifiers, such as providing greater efficiency and less over-heating issues if used in high power applications. As opposed to Class A power amplifiers which utilize one transistor to amplify an entire waveform, Class B power amplifiers utilize two complimentary transistors, where each transistor amplifies one half of the analog waveform of the supply signal. However, while Class B power amplifiers provide greater efficiency than Class A power amplifiers, signal distortions will be introduced in the waveform crossover/deadband region utilizing the Class B power amplifiers. Class AB power amplifiers generally combine Class A and Class B power amplifiers to provide reduced signal distortion associated with the crossover region while losing the efficiency of Class B power amplifiers due to the crossover current of both complementary transistors being on, somewhat in the crossover region. For Class AB power amplifiers, a combination of diodes and resistors are typically used to provide small amounts of bias voltage to reduce the distortion of the supply waveform at the crossoverregion. Class AB power amplifiers can be tailored to have no deadband region at the cost of efficiency while Class B power amplifiers have good efficiency at the cost of significant deadband regions. By utilizing Class B embodiments of the disclosed SpreadAmp, much lower deadband regions can be achieved which start to approach Class B performance while maintaining good efficiency by avoiding crossover currents, as described below.

Figure 12:
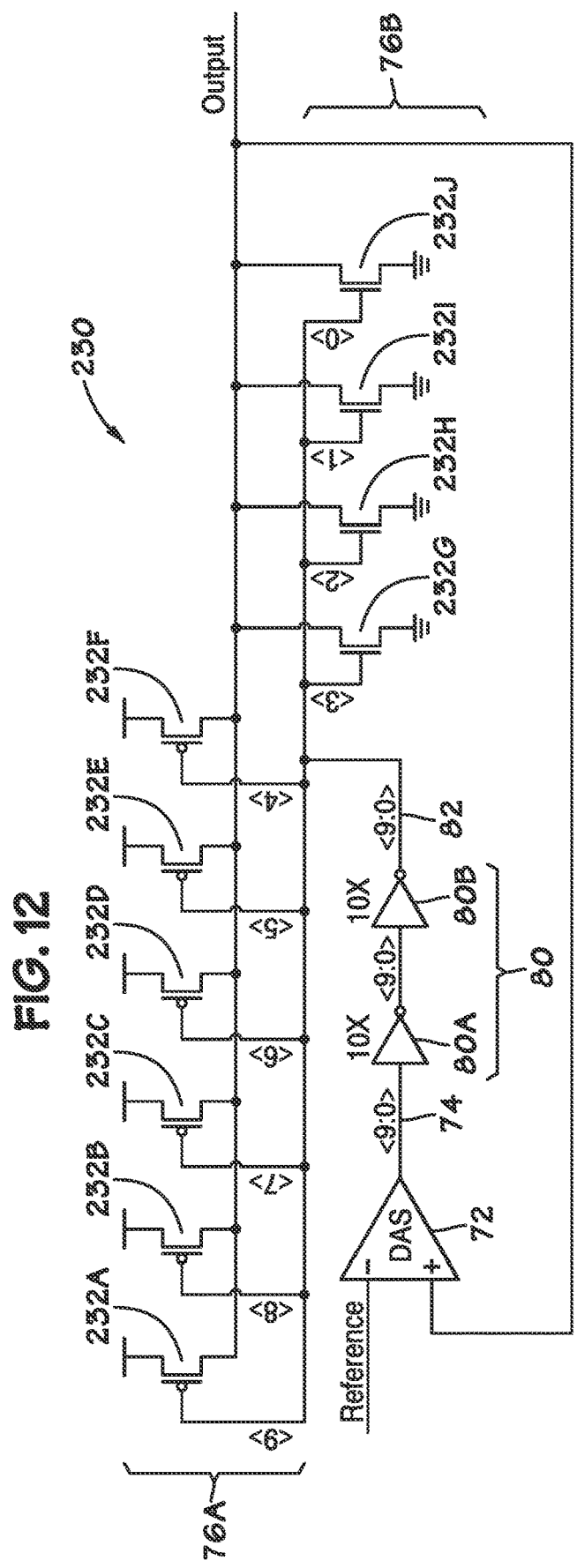
FIG. 12 is a simplified schematic diagram of a Class B SpreadAmp, in accordance with another embodiment.

Generally, applications requiring tight control while subject to both pull-up and pull-down loads typically utilize Class AB power amplifiers. Class AB power amplifiers employ significant crossover currents, unlike Class B power amplifiers. As illustrated in FIG. 12, a SpreadAmp 230 may be employed utilizing embodiments described herein. The SpreadAmp 230 provides a Class B implementation having a deadband region that is closer to that of a Class AB implementation. The SpreadAmp 230 is similar to the SpreadAmp 70 of FIG. 3, with the exception of the final driver stage 76. That is, rather than providing a single sided Class AB configuration, as in FIG. 3, the final driver stage 76 includes a pull-up final driver stage 76A and a pull-down final driver stage 76B, as with a normal Class B configuration. In the illustrated embodiment, the pull-up final driver stage 76A includes final drivers 232A-232F (e.g., p-channel transistors) arranged to receive digital outputs <9:4> 82 (i.e., indexes <9:4>). Similarly, the pull-down final driver stage 76B includes final drivers 232G-232J (e.g., n-channel transistors) arranged to receive digital outputs <3:0> 82 (i.e., indexes <3:0>).

By having graded flip points (i.e., indexes <9:0>) the resolution of index-to-index change is tight such that there is very little deadband in the Class B configuration of the SpreadAmp 230. As appreciated, traditional Class B configurations would typically produce a deadband of significant amount at the switch point from the p-channel devices to n-channel devices. However, using the SpreadAmp 230 and multiple indexes <9:0>, the deadband is reduced to the 0.5 mV range making it closer in performance to that of a class AB power amplifier, without the associated crossover currents. As mentioned later skipping an index near the crossover point may be advantageous for stability. This skipped index may be used in another mode. For instance, gating could be used to have different drivers between standby and active modes such that all indexes could be utilized by PCH drivers in active mode but while in standby, gating configures the indexes to use both PCH and NCH, as in FIG. 12 with a possible skipped index near the crossover.

Further, embodiments of the disclosed SpreadAmp enable unique stability choices, such as adding delays at index-to-index changes. Other techniques may also be employed to help stability. For instance, with regard to the SpreadAmp 230, an extra gap in DAS grading between PCH and NCH indexes (e.g., between index<4> and index<3>), use of small transistors near PCH and NCH index transitions or skipping indexes near PCH and NCH index transition may all help provide additional stability. Additional gating in the SpreadAmp 230 can also block crossover of PCH and NCH indexes due to cascode microvariations. Combining multiple Class B power amplifiers can use a control line from one master power amplifier to determine allowable PCH or NCH use, avoiding crossing currents globally between Spread-Amps.

Technical effects of the present embodiments include providing a SpreadAmp configured to produce a spread of graded outputs that can be used to provide more final drive capability for a given power amplifier bias overhead current, compared to traditional power amplifiers. For larger loads, the overhead current and power usage may be significantly reduced using embodiments of the disclosed SpreadAmp. Logic gating and provision of multiple final drivers allow for near-analog control of supply signals (e.g., supply voltage signals). Further, utilizing embodiments of the SpreadAmp for VDQS regulation provides similar peak-to-peak supply variation while doing it with less than $\frac{1}{5}^{th}$ the current draw overhead compared to standard power amplifier implementations. For VARY implementations, embodiments of the SpreadAmp can cut the averaged current draw overhead to $\frac{1}{3}^{rd}$ compared to standard power amplifier implementations. For the disclosed embodiments of the Class B SpreadAmp implementation, allowance of a small deadband, while eliminating crossover currents exhibited in other applications with similar voltage control can be achieved.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   a differential amplifier spread (DAS) configured to receive a pair of input signals and to provide a plurality of graded outputs each having different output levels; and
   a final driver stage comprising a plurality of final drivers, wherein each of the final drivers is configured to receive a respective one of the plurality of graded outputs.

2. The device of claim 1, wherein each of the plurality of final drivers comprises a p-channel metal oxide field effect transistor (MOSFET) device configured to receive the respective one of the plurality of graded outputs at a gate terminal.

3. The device of claim 2, wherein a drain of each of the plurality of final drivers is coupled together at a node to provide a single controlled output voltage from the final driver.

4. The device of claim 1, wherein the final driver stage comprises a pull-up final driver stage comprising a first number of the plurality of final drivers and a pull-down final driver stage comprising a second number of the plurality of final drivers.

5. The device of claim 4, wherein each of the plurality of final drivers in the pull-up final driver stage comprises a p-channel MOSFET device configured to receive the respective one of the plurality of graded outputs at a gate terminal, and wherein each of the plurality of final drivers in the pull-down final driver stage comprises an n-channel MOSFET device configured to receive the respective one of the plurality of graded outputs at a gate terminal.

6. The device of claim 1, comprising a replica of the final drivers capacitively coupled to a partially isolated feedback path of the device.

7. The device of claim 1, wherein each of the plurality of final drivers is configured to produce a respective voltage output having an associated peak voltage peak-to-peak voltage difference of less than 10 mV.

8. The device of claim 1, wherein the differential amplifier is configured to provide a plurality of graded analog outputs.

9. The device of claim 8, comprising a plurality of gate chains, wherein each gate chain is configured to receive a respective one of the plurality of graded analog outputs from the DAS and to provide a digital output to a respective one of the plurality of final drivers.

10. The device of claim 1, wherein the DAS comprises a plurality of legs each having a different strength to produce each of the plurality of graded outputs.

11. The device of claim 10, wherein each of the plurality of legs comprises a differential pair controlled mirror leg.

12. The device of claim 10, wherein each of the plurality of legs comprises a cascode.

13. The device of claim 12, wherein each cascode comprises a p-channel MOSFET device and two n-channel MOSFET devices and wherein each of the plurality of cascodes has a different P/N controlling ratio.

14. The device of claim 1, wherein the device is a double data rate type five synchronous dynamic random access memory (DDR5 SDRAM) device.

15. The device of claim 1, wherein the device is a double data rate (DDR) memory device comprising a write clock tree, wherein the DAS is configured to receive a VDQS signal and to provide a plurality of graded analog outputs each having different output levels, responsive to the VDQS signal for usage by the write clock tree.

16. The device of claim 15, wherein the device is a double data rate (DDR) memory device comprising a memory array, wherein the DAS is configured to receive a VARY signal and to provide a plurality of graded digital outputs each having different output levels, responsive to the VDQS signal for usage by the memory array.

17. A device, comprising:
a differential amplifier spread (DAS) configured to receive a pair of input signals and to provide a plurality of graded analog outputs each having different output levels, wherein one of the pair of input signals is a VDQS signal;
gating circuitry configured to receive the plurality of graded analog outputs and to provide a plurality of digital outputs; and
a plurality of final driver stages, wherein each of the plurality of final driver stages is configured to receive at least one of the plurality of digital outputs.

18. The device of claim 17, wherein the plurality of final driver stages comprises a first final driver stage and a second final driver stage, each configured to control a write clock tree, wherein the first final driver stage is configured to receive a first number of the plurality of digital outputs, and wherein the second final driver stage is configured to receive a second number of the plurality of digital outputs.

19. The device of claim 18, comprising a replica of final drivers in the first final driver stage and the second final driver stage capacitively coupled to a partially isolated feedback path of the device.

20. The device of claim 18, wherein each of the first final driver stage and the second final driver stage is configured to selectively operate in a X4 and a X8 mode.

21. The device of claim 17, wherein the plurality of final driver stages comprises a DQS input buffer final driver stage configured to control a plurality of input buffers, and wherein the DQS input buffer final driver stage is configured to receive each of the plurality of digital outputs.

22. The device of claim 17, wherein the plurality of final driver stages comprises a standby final driver stage configured to precondition the DAS during a standby mode, wherein the standby final driver stage is configured to receive a digital output corresponding to one of the graded analog outputs, wherein the one of the graded analog outputs has a voltage level in approximately the middle of a range of voltage levels of the plurality of graded analog outputs.

23. A device, comprising:
a differential amplifier spread (DAS) configured to receive a pair of input signals and to provide a plurality of graded digital outputs each having different output levels, wherein one of the pair of input signals is a VARY signal; and
at least one final and peg driver stage, wherein the at least one final and peg driver stage is configured to receive a plurality of signals indicative of the plurality of graded digital outputs.

24. The device of claim 23, comprising an encoder, wherein the encoder is configured to receive each of the plurality of graded digital outputs and to provide the plurality of signals indicative of the plurality of graded digital outputs to the at least one final and peg driver stage.

25. The device of claim 23, comprising a plurality of memory banks and at least one interior final driver arranged between adjacent memory banks of the plurality of memory banks, wherein the at least one interior final driver is configured to receive one of the plurality of graded digital outputs and to provide additional drive of the VARY signal to the adjacent memory banks.

26. The device of claim 23, wherein the at least one final and peg driver stage comprises a plurality of final drive and peg bit blocks, wherein each of the plurality of final drive and peg bit blocks is configured to receive a respective one of the plurality of graded digital outputs from the DAS and a peg drive indicator bit among the plurality of graded digital outputs from the DAS.

27. The device of claim 26, wherein each of the plurality of final drive and peg bit blocks comprises a final driver and a peg driver, wherein each of the final driver and the peg driver comprises a transistor.

28. The device of claim 27, wherein each of the plurality of final drive and peg bit blocks comprises and SR latch configured to detect maximum final driver power and activate the peg driver.

29. The device of claim 23, wherein the at least one final and peg driver stage comprises a plurality of final and peg driver stages each arranged in a respective one of a plurality of memory banks.

* * * * *

UNITED STATES PATENT AND TRADEMARK OFFICE
CERTIFICATE OF CORRECTION

| | | |
|---|---|---|
| PATENT NO. | : 11,183,980 B1 | Page 1 of 2 |
| APPLICATION NO. | : 16/925590 | |
| DATED | : November 23, 2021 | |
| INVENTOR(S) | : Brian W. Huber | |

It is certified that error appears in the above-identified patent and that said Letters Patent is hereby corrected as shown below:

In the Specification

In Column 1, Line 65, delete "FIG. 6 a simplified schematic" and insert --FIG. 6 is a simplified schematic--, therefor.

In Column 3, Line 34, delete "final drivers s to" and insert --final drivers to--, therefor.

In Column 4, Line 13, delete "the number graded outputs" and insert --the number of graded outputs--, therefor.

In Column 8, Line 22, delete "signal from the final driver 54 if fed-back" and insert --signal from the final driver 54 is fed-back--, therefor.

In Column 13, Line 63, delete "using the DA 52 (FIG. 3)." and insert --using the DA 52 (FIG. 2).--, therefor.

In Column 15, Line 63, delete "device such a p-channel" and insert --device such as p-channel--, therefor.

In Column 19, Line 18, delete "the head enable transistors 222" and insert --the header enable transistors 222--, therefor.

In Column 19, Line 53, delete "corresponding to cascode 220H is not yet on," and insert --corresponding to cascode 220H is not yet on),--, therefor.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,183,980 B1

In the Claims

In Column 22, Line 66, delete "to the VDQS signal for" and insert --to the VARY signal for--, therefor.

In Column 24, Line 35, delete "comprises and SR latch" and insert --comprises a SR latch--, therefor.